US007336085B2

(12) United States Patent
Fabbro et al.

(10) Patent No.: US 7,336,085 B2
(45) Date of Patent: Feb. 26, 2008

(54) CURRENT SENSING CIRCUIT

(75) Inventors: Simone Fabbro, Villach (AT); Karl Norling, Villach (AT); Christian Lindholm, Villach (AT)

(73) Assignee: Infineon Technologies AG, Munich (DE)

( * ) Notice: Subject to any disclaimer, the term of this patent is extended or adjusted under 35 U.S.C. 154(b) by 55 days.

(21) Appl. No.: 11/357,393

(22) Filed: Feb. 17, 2006

(65) Prior Publication Data

US 2007/0205778 A1 Sep. 6, 2007

(51) Int. Cl.
*G01R 27/08* (2006.01)

(52) U.S. Cl. ........................................ 324/713; 324/691

(58) Field of Classification Search ................. 324/713
See application file for complete search history.

(56) References Cited

U.S. PATENT DOCUMENTS 4,553,084 A 11/1985 Wrathall
5,079,456 A 1/1992 Kotowski et al.
5,166,549 A * 11/1992 DeDoncker .................. 327/79
5,272,392 A * 12/1993 Wong et al. ................ 327/109
5,635,823 A * 6/1997 Murakami et al. .......... 323/277
5,903,422 A * 5/1999 Hosokawa ................. 361/93.1
6,396,311 B2 * 5/2002 Inn ............................ 327/70
2003/0218455 A1 11/2003 Tai et al.
2004/0155662 A1 8/2004 Graf et al.
2004/0227539 A1 11/2004 Thiery
2005/0127888 A1 6/2005 Marschalkowski et al.
2006/0028192 A1 * 2/2006 Ryu et al. .................. 323/312
2006/0250153 A1 * 11/2006 Colbeck ..................... 324/769

FOREIGN PATENT DOCUMENTS

DE 102 58 766 A1 7/2004
DE 103 14 842 A1 10/2004

* cited by examiner

*Primary Examiner*—Anjan Deb
*Assistant Examiner*—Timothy J Dole
(74) *Attorney, Agent, or Firm*—Eschweiler & Associates, LLC

(57) ABSTRACT

A circuit arrangement for detecting a load current through a load includes a main transistor, a sensing transistor through which a load current flows that is a measure of the load current flowing through the main transistor. In addition, a resistance is connected in series with the load path of the sensing transistor, and a current source is connected to a node arranged between the sensing transistor and the resistance. A detector detects the load current flowing through the main transistor by measuring the voltage across the resistance.

24 Claims, 4 Drawing Sheets

1
VDD
M5
M6
M7
Iload
M1
Vout
Iload/N
M2
M3
M4
Iref
Rsense
R1
VSS

2
VDD
Iref
Iload
M1
OPA
Iload/N
M3
M2
R1
Rsense
VSS

CURRENT SENSING CIRCUIT

FIELD OF THE INVENTION

The present invention relates generally to a current sensing circuit and method, and more particularly to a circuit for detecting a load current through an integrated switch.

BACKGROUND OF THE INVENTION

Many applications and implementations that employ integrated switches, such as integrated switched mode power converters, may require that the current flowing through the switches is monitored or compared with given reference values. The reasons for this are related either to regulation or control aspects or to the implementation of additionally required features, such as many kinds of current limitation circuits.

The adopted solutions suitable for silicon integration found so far are always based on the combination of the real switch device carrying the current of interest with a smaller replica or replicas of the switch itself. Typically the real switch device is an integrated MOS transistor through which the load current flows. The switch device and its replica, which can be the unity cell of the larger switch device, are arranged together in a way that a current flows through the replica which is in principle proportional to the interested current. The factor between the current through the switch device and the current through the replica is in principle the integer area scaling factor between the two switch devices. By employing this principle the prior art solutions often do not overcome either the constraint of not having a negative supply rail or the problem that the current flowing in the larger device might have the opposite direction than the current flowing in the replica or in a part of the replicas. This is especially the case in buck converters where the current in the switches always flows towards the external coil. Various conventional current sensing circuits used for switch devices are shown in FIG. 1 to FIG. 3.

In FIG. 1 MOS transistors M1 and M2 are shown acting as a switch device and its replica, respectively. A current Iload flows through the transistor M1, whereas a scaled current Iload/N flows through the transistor M2. Transistors M3, M4, M5 and M6 form a comparator that compares the scaled current Iload/N with a reference current Iref supplied by a current source.

If the current Iload and the scaled current Iload/N enter the drains of the transistors M1 and M2, respectively, the output voltage Vout changes its state when Iload/N=Iref*R1/Rsense (inaccuracies have been neglected) meaning Vout=0 if Iload/N>Iref*R1/Rsense and Vout=VDD if Iload/N<Iref*R1/Rsense. If, however, the current Iload has the opposite direction, which for example may happen in buck converters, the circuit arrangement 1 as shown in FIG. 1 is no longer able to compare the scaled current Iload/N with the reference current Iref. In order to make the circuit work properly, a parallel comparator, which is similar to one formed by the transistors M3 to M6 but mirrored in order to use a negative supply rail, would be necessary. Apart from having additional circuitry the problem is that often no negative rail is available. Moreover, matching issues involving both transistors and resistors may occur and the sensing resistor Rsense introduces a voltage difference in the gate voltage that results in current measurement inaccuracies.

In FIG. 2 a more accurate solution is shown compensating the voltage drop across the sensing resistor Rsense in case that the ON resistance of the transistor M2 is not low enough in comparison with the sensing resistance Rsense. In the circuit arrangement 2 a transistor M3 and a resistor R1 form an additional replica of the switch device M1 and are used as compensating elements. In this case an operational amplifier OPA used as a comparator changes its state if Iload/N>Iref.

However, the current sensing circuit shown in FIG. 2 does not work if the current Iload flows in the opposite direction because the current flowing through the transistor M3 would not notice direction change. Furthermore, matching issues related to transistors and resistors may also appear in the current sensing circuit of FIG. 2.

In FIG. 3 a circuit arrangement 3 is shown that overcomes some of the problems addressed above. The virtual ground created by an operational amplifier OPA is used to read the scaled current Iload/N and send it through the transistor M3. In this case the current Iload can be ejected from the drain of the transistor M1 and the output voltage Vout changes to ground potential if Iload/N>Iref. Nevertheless, this solution requires a fast amplifier, at least in the case of relatively high switching frequencies, and might therefore conflict with the current consumption budget. Moreover, the current sensing circuit shown in FIG. 3 does not work if the current Iload feeds the drain of the transistor M1.

Adapting the circuit arrangement 3 for this case again involves quite complex additional circuitry: typically a fixed current biasing the transistor M3 would be implemented so that the transistor M3 is always conducting even if the current Iload flows in the opposite direction. This might again conflict with minimum current consumption requirements.

Further current sensing circuits are disclosed in the U.S. patent application publications nos. US 2003/0218455 A1, US 2004/0155662 A1, US 2004/0227539 A1 and US 2005/0127888 A1 as well as in the German laid open documents DE 102 58 766 A1 and DE 103 14 842 A1.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

One or more aspects of the invention provide a circuit arrangement for efficiently detecting a load current through a load.

One or more aspects of the invention also provide a circuit arrangement and a method for efficiently sensing the current flowing through a transistor.

The circuit arrangement may handle currents flowing in opposite directions.

Additionally, a detection point can be independent from the value of the sensing resistor.

In accordance with an aspect of the invention, a circuit arrangement for detecting a load current through a load is provided. The circuit arrangement comprises a main transistor carrying a great part of the load current, a sensing (or auxiliary) transistor carrying the minor part of the load current, a means of resistance, a current source and a detector. The main transistor has a load path which is connected in series with the load. The sensing transistor has a load path through which a load current flows which is a measure of the load current flowing through the load path of the main transistor. The means of resistance is connected in series with the load path of the sensing transistor. The current source is connected to a node which is arranged between the sensing transistor and the means of resistance. The detector measures the voltage across the means of resistance and thereby detects the load current flowing through the main transistor.

One embodiment of the present invention is characterized in that the detector is designed as a zero-voltage crossing detector. The detector detects whether or not the amount of current supplied by the current source equals the amount of current flowing through the second transistor if the current supplied by the current source flows in the same direction as the current flowing through the load path of the sensing transistor. In case the current of the current source equals the current through the second transistor, no current flows through the means of resistance and there is no voltage drop across the means of resistance.

In one embodiment of the circuit arrangement according to the invention, the direction and/or the value of the current supplied by the current source are adjustable and/or controllable.

In accordance with one aspect of the invention, provision is made of a sign detector that detects the sign of the voltage across the means of resistance and a controller that controls the direction of the current supplied by the current source. Controlling the current supplied by the current source depends on the sign of the voltage across the means of resistance.

The direction of the current supplied by the current source and controlled by the controller can optionally further depend on whether the load current flowing through the main transistor decreases or increases.

One embodiment of the present invention is characterized in that the controller has access to a look-up table, which lists the direction of the current supplied by the current source versus the sign of the voltage across the means of resistance and the sign of the derivative of the load current flowing through the main transistor.

In accordance with one embodiment of the invention a circuit arrangement for sensing the current flowing through a first transistor has been achieved. The circuit arrangement comprises a first transistor, a second transistor through which flows a current that is a measure of the current flowing through the first transistor, a sensing resistor which is connected via a node to the second transistor, and a current source which feeds a current to or draws a current from the node between the second transistor and the sensing resistor, wherein the voltage across the sensing resistor is a measure for the current flowing through the first transistor.

Furthermore, in accordance with one embodiment of the invention, a method to sense the current flowing through a first transistor has been achieved. The method comprises, first, providing a second transistor through which flows a current that is a measure of the current flowing through the first transistor and a sensing resistor which is connected via a node to the second transistor. The method involves feeding a current to or drawing a current from the node between the second transistor and the sensing resistor. Furthermore, the voltage across the sensing resistor, which is a measure for the current flowing through the first transistor, is to be sensed.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
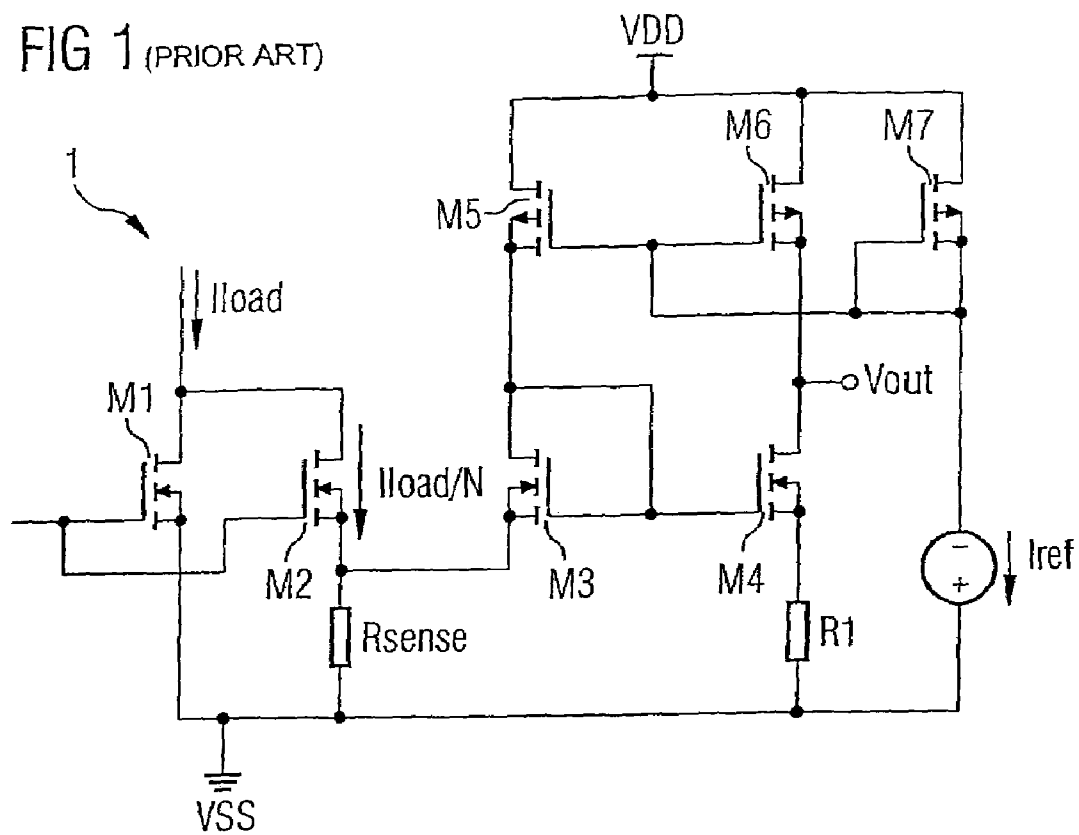
FIG. 1 schematically illustrates a prior art circuit arrangement for detecting a load current through a transistor.
Figure 2:
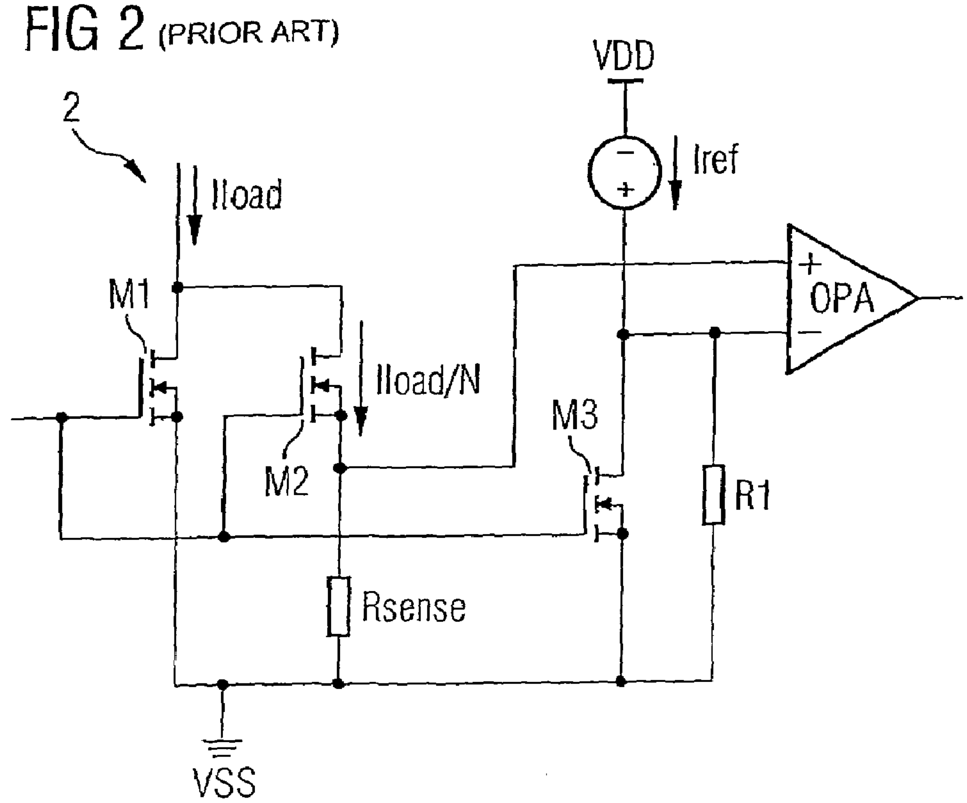
FIG. 2 schematically illustrates another prior art circuit arrangement for detecting a load current through a transistor.
Figure 3:
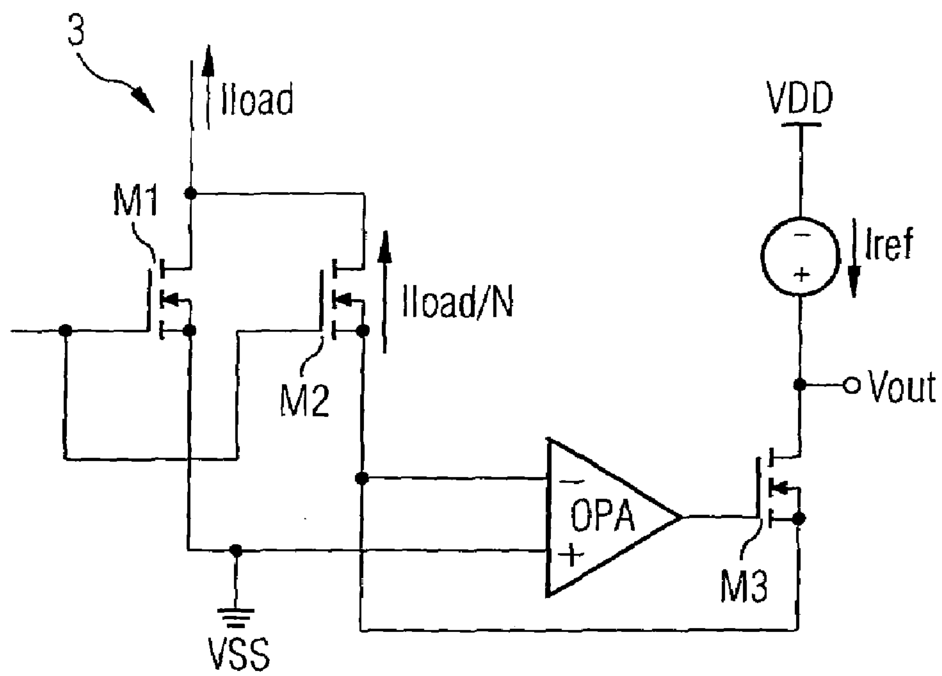
FIG. 3 schematically illustrates a further prior art circuit arrangement for detecting a load current through a transistor.

One or more aspects and/or embodiments of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, known structures and devices are shown in block diagram form in order to facilitate describing one or more aspects of the present invention. The following description, therefore, is not to be taken in a limiting sense, and the scope of the present invention is defined by the appended claims.

Figure 4:
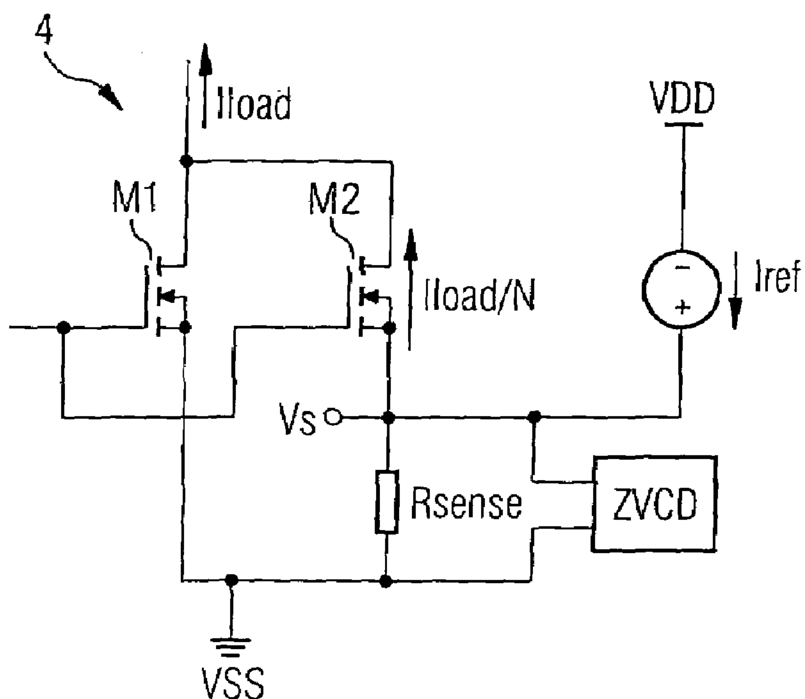
FIG. 4 schematically illustrates a first exemplary embodiment of a circuit arrangement according to the invention, in which the transistor M1 forms a low-side switch and the circuitry surrounding the transistor M1 implements the current sensing.

In FIG. 4 a first embodiment of the circuit arrangement according to the invention is designated by the reference numeral 4. In this embodiment of the circuit arrangement according to the invention, a main transistor M1 and a sensing transistor M2 are provided. Both transistors M1 and M2 are n-channel MOS transistors and are interconnected on their drain sides. Furthermore, the control terminal of the sensing transistor M2 is connected to the control terminal of the main transistor M1. The load path of the main transistor M1 is connected in series with the load, which is not shown in FIG. 4. A load current Iload flows through the load path of the main transistor M1. Since the area (or the width) of the sensing transistor M2 has a value which is a fraction 1/N of the area (or the width) of the main transistor M1, a scaled current Iload/N flows through the load path of the sensing transistor M2. The area (or the width) of the main transistor M1 is much larger than the area (or the width) of the sensing transistor M2 so that the current Iload is much bigger than the current Iload/N. The factor N may be selected appropriately.

The source terminal of the main transistor M1 is connected to a reference potential VSS, for example ground potential. Between the source terminal of the sensing transistor M2 and the reference potential VSS a sense resistor Rsense is arranged. The node between the sensing transistor M2 and the sense resistor Rsense is connected to a current source which feeds a reference current Iref in this node. The node has the potential Vs. A zero-voltage crossing detector ZVCD measures the voltage drop across the sense resistor Rsense and indicates when this voltage is 0V. The circuit arrangement 4 is integrated in silicon by CMOS (complementary metal oxide semiconductor) technology.

For the case where the supply potential VDD is the higher potential and the reference potential VSS is the lower potential, for example ground, and the main transistor M1 is an n-channel MOS transistor, the circuit arrangement 4 forms a so-called low-side switch.

The circuit arrangement 4 can be used to sense and compare the current Iload flowing through the integrated switch. As can be seen from FIG. 4, the scaled current Iload/N is sunk from the higher node of the sense resistor Rsense and at the same time the reference current Iref is sourced to the same node. As a result, according to Kirchhoff's law, when Iload/N=Iref, no current flows through the sense resistor Rsense and the node between the sensing transistor M2 and the sense resistor Rsense is at the reference potential VSS meaning that the voltage Vs at the node is 0V. This occurrence will be detected by the zero-voltage crossing detector ZVCD. At that moment the current Iload is N*Iref. The absolute value of the reference current Iref can be adjusted or selected appropriately in order to measure a different value of the current Iload flowing through the main transistor M1.

Detecting the current of interest when Vs=0 has the advantage that at this particular moment the gate-source and drain-source voltages of the main transistor M1 and the sensing transistor M2 are exactly the same, providing an optimal condition against inaccuracies in the current measurement. It shall be noted that the detection point (Vs=0) is in any case independent from the value of the sense resistor Rsense. Furthermore, the circuit arrangement 4 shown in FIG. 4 can facilitate accuracy and implementation.

In FIG. 4 the current Iload is emitted from the drain terminal of the main transistor M1. Handling a current Iload that flows in the opposite direction is possible as well by inverting the direction of the reference current Iref.

Figure 5:
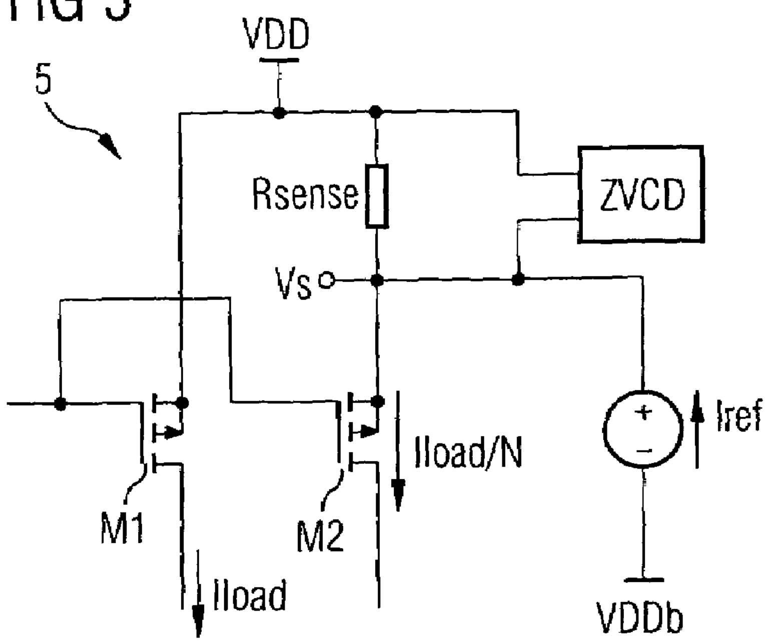
FIG. 5 schematically illustrates a second exemplary embodiment of a circuit arrangement according to the invention, in which the transistor M1 forms a high-side switch and the circuitry surrounding the transistor M1 implements the current sensing.

In FIG. 5 a second embodiment of the circuit arrangement according to the invention is designated by the reference numeral 5. In contrast to the circuit arrangement 4 shown in FIG. 4, FIG. 5 shows how the inventive concept can be implemented into a high-side switch. In FIG. 5 the same elements as in FIG. 4 are provided with the same reference symbols.

In the circuit arrangement 5 the main transistor M1 and the sensing transistor M2 are p-channel MOS transistors. The control terminal of the sensing transistor M2 is connected to the control terminal of the main transistor M1. The load path of the main transistor M1 is connected in series with the load, which is not shown in FIG. 5. A load current Iload flows through the load path of the main transistor M1. Since the width (or the area) of the sensing transistor M2 has a value which is a fraction 1/N of the width (or the area) of the main transistor M1, a scaled current Iload/N flows through the load path of the sensing transistor M2. The factor N may be selected appropriately.

The source terminal of the main transistor M1 is connected to the supply potential VDD, whereas between the source terminal of the sensing transistor M2 and the supply potential VDD a sense resistor Rsense is arranged. The node between the sensing transistor M2 and the sense resistor Rsense is connected to a current source which feeds a current Iref in this node. The node has the potential Vs. A zero-voltage crossing detector ZVCD measures the voltage drop across the sense resistor Rsense and indicates when this voltage is 0V. The circuit arrangement 5 is integrated in silicon by CMOS (complementary metal oxide semiconductor) technology.

In the circuit arrangement 5 the current source generating the reference current Iref may require a supply potential VDDb that is higher than the supply potential VDD. This obstacle can be overcome in switched systems by applying bootstrap techniques. This is exemplarily shown in FIG. 6.

Figure 6:
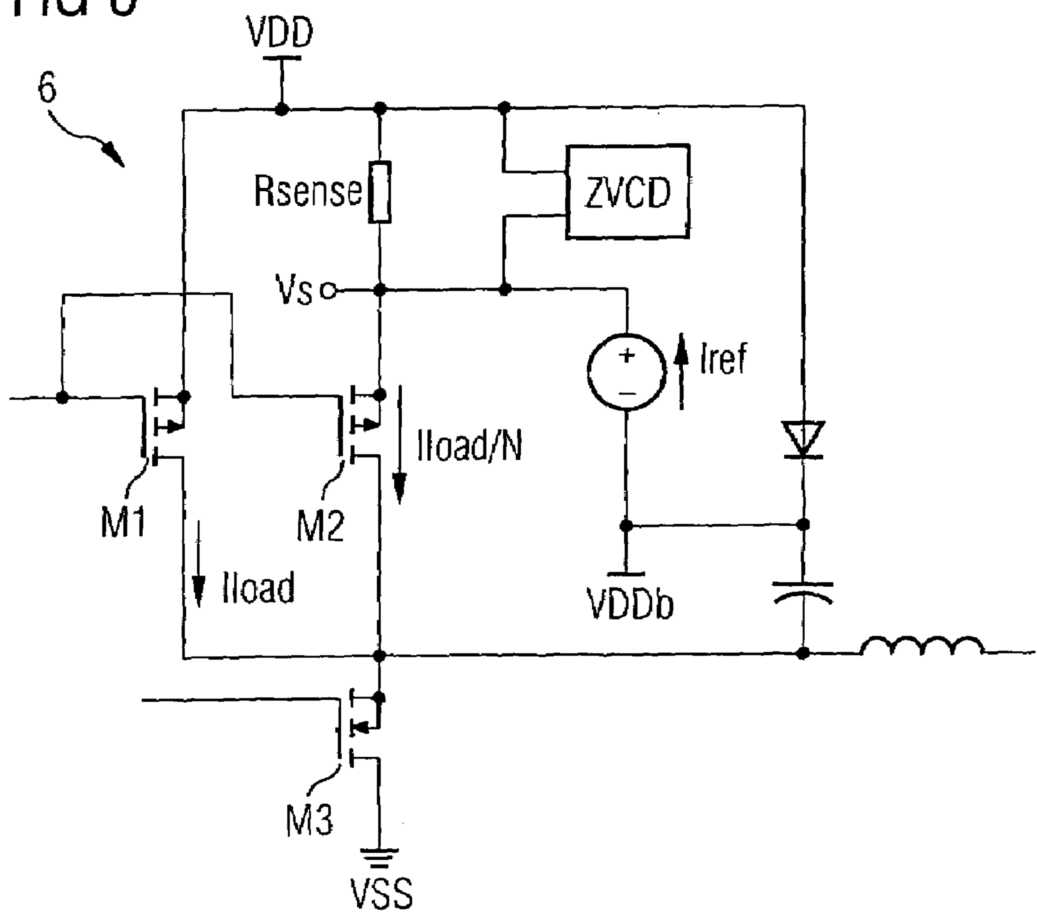
FIG. 6 schematically illustrates a third exemplary embodiment of a circuit arrangement according to the invention, in which the circuit arrangement shown in FIG. 5 is embedded in a buck converter.

In FIG. 6 a third embodiment of the circuit arrangement according to the invention is designated by the reference numeral 6. The circuit arrangement 6 is a buck converter comprising the circuit arrangement 5 shown in FIG. 5. As can be seen from FIG. 6, the supply potential VDDb being higher than the supply potential VDD is in this example obtained by bootstrapping the switching node.

Figure 7:
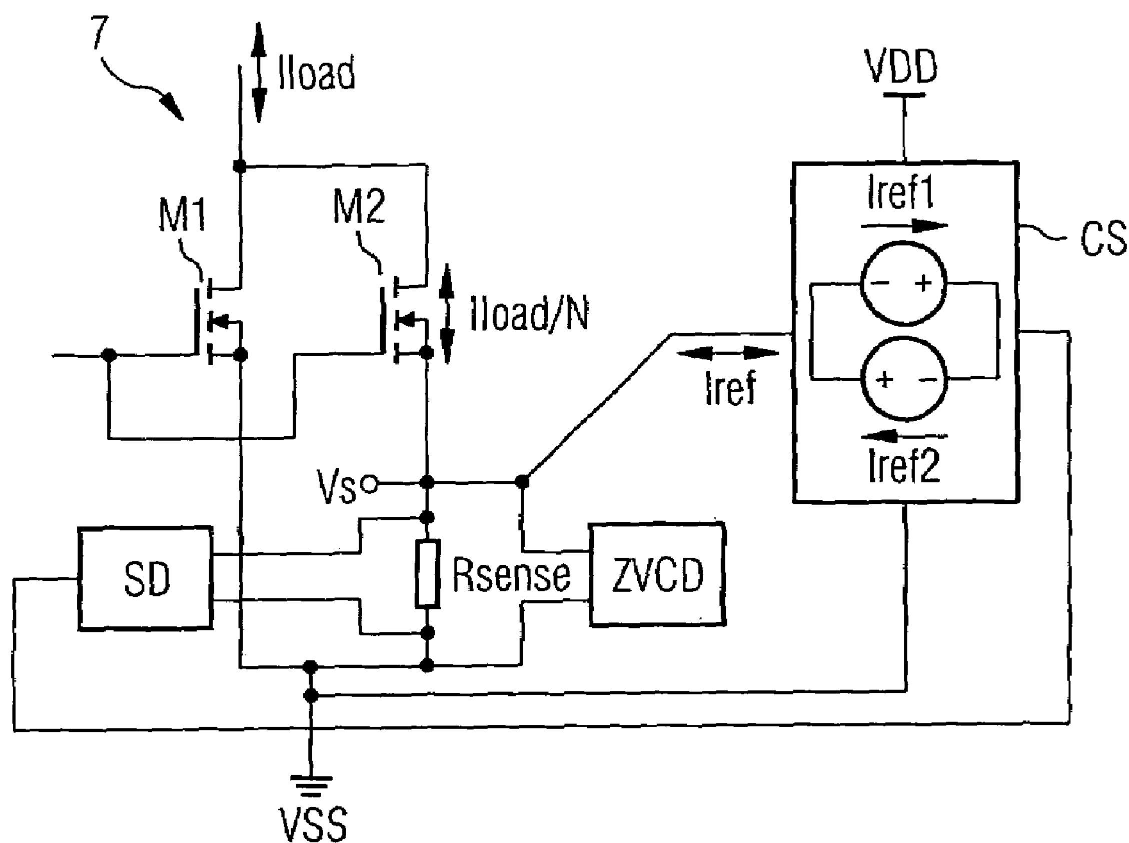
FIG. 7 schematically illustrates a fourth exemplary embodiment of a circuit arrangement according to the invention, in which the reference current Iref is able to flow in both directions.

In FIG. 7 a fourth embodiment of the circuit arrangement according to the invention is designated by the reference numeral 7. The circuit arrangement 7 is a low-side switch and is based on the circuit arrangement 4 shown in FIG. 4. Therefore the same elements as in FIG. 4 are provided with the same reference symbols in FIG. 7. The circuit arrangement 7 exceeds the circuit arrangement 4 by providing the possibility that the current Iload is bidirectional. For this purpose a current source CS is provided that can either draw a reference current Iref1 from the node between the sensing transistor M2 and the sense resistor Rsense or feed a reference current Iref2 in this node. Furthermore, a sign detector SD detects the sign of the voltage Vs across the sense resistor Rsense.

In many applications the way how the current of interest Iload varies over time is known and it is also known whether a zero-voltage crossing of the voltage across the sense resistor Rsense coming from negative values of the potential Vs or from positive values of the potential Vs has to be expected. As a result it is possible to determine when, during the operation, it is necessary to apply a reference current Iref1 or a reference current Iref2 by monitoring the sign of the potential Vs. This information is provided by the sign detector SD.

Figure 8:
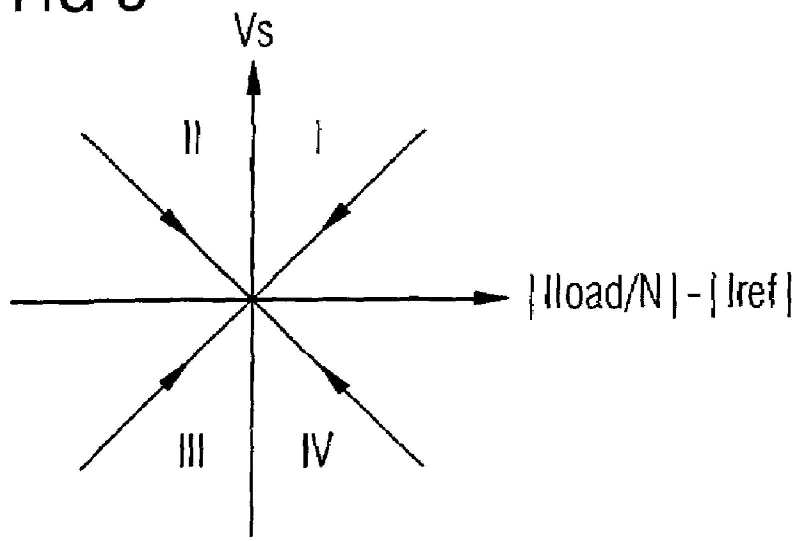
FIG. 8 shows a plot of the voltage Vs across the sensing resistor Rsense versus the current Isense flowing through the sensing resistor Rsense in order to illustrate the mode of operation of the circuit arrangement shown in FIG. 7.

In order to make clear how the circuit arrangement 7 works a V-I plot is shown in FIG. 8 which illustrates all possible operation modes according to the potential Vs. In FIG. 8 the voltage Vs across the sensing resistor Rsense is plotted versus the current Isense=|Iload/N|−|Iref| flowing through the sense resistor Rsense. The slope of the straight lines is the value of the sense resistor Rsense.

According to every possible gradient (increasing or decreasing current) and the direction of the current Iload (current sunk or sourced from the main transistor M1), the plot of FIG. 8 shows which sign (positive or negative) and direction (increasing or decreasing) of the potential Vs has to be expected.

The sign detector SD detects the sign of the potential Vs, whereas the information on the gradient of the current Iload, which is directly related to the increase or decrease of the potential Vs, is either known and stored in a look-up table or comes from a control state machine or is measured. In this way it is possible to know where the operation condition of the circuit should be placed in the given V-I plot and to know which direction the reference current Iref should have.

In the following the procedure how to determine the direction of the reference current Iref is explained in more detail. For this the following conventions are established:

1. A current Iload flowing into the drains of the main transistor M1 and the sensing transistor M2 and towards their sources is a positive current Iload.
2. A reference current Iref flowing from the current source CS towards the node at which the potential Vs is measured is a positive reference current Iref.

Further, as shown in FIG. 8 the V-I plot is divided into four quadrants denoted with the reference numerals I, II, III and IV. If the sign of the voltage Vs as well as the sign (direction) of the current Iload are known and it is also known whether a higher limit or a lower limit of the current Iload shall be detected, the sign (direction) of the reference current Iref can be determined from the following four cases which are related to the four quadrants I, II, III and IV of FIG. 8.

I. If Vs>0 and Iload>0, then Iref<0. A lower limit of a decreasing current Iload entering the drain of the main transistor M1 is detected.

II. If Vs>0 and Iload<0, then Iref>0. A higher limit of an increasing current Iload sourced from the drain of the main transistor M1 is detected.

III. If Vs<0 and Iload>0, then Iref<0. A higher limit of an increasing current Iload entering the drain of the main transistor M1 is detected.

IV. If Vs<0 and Iload<0, then Iref>0. A lower limit of a decreasing current Iload sourced from the drain of the main transistor M1 is detected.

The four preceding cases can be implemented into a look-up table.

In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms “includes”, “having”, “has”, “with”, or variants thereof are used in either the detailed description or the claims, such terms are intended to be inclusive in a manner similar to the term “comprising.” Also, the term “exemplary” is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

LIST OF REFERENCE NUMERALS

1 to 7 circuit arrangements
M1 main transistor
M2 sensing transistor
M3 to M7 transistors
Rsense sense resistor
R1 resistor
OPA operational amplifier
ZVCD zero-voltage crossing detector
SD sign detector
CS current source
Iload current
Iload/N scaled current
Iref reference current
Iref1 reference current
Iref2 reference current
Isense current
Vout output voltage
VDD supply potential
VDDb supply potential
VSS reference potential
I to IV quadrants

What is claimed is:

1. A circuit arrangement for detecting a load current through a load, the circuit arrangement comprising:
a main transistor having a load path through which the load current passes, wherein the load is connected in series with the load path of the main transistor;
a sensing transistor having a load path, wherein a measure of the load current flows through the load path of the sensing transistor;
a resistance which is connected in series with the load path of the sensing transistor;
a current source which is connected to a node arranged between the sensing transistor and the resistance; and
a detector which detects the load current flowing through the main transistor by measuring the voltage across the resistance;
wherein the detector is a zero-voltage crossing detector.

2. The circuit arrangement of claim 1, wherein the direction and/or the value of the current supplied by the current source are controllable.

3. The circuit arrangement of claim 1, wherein the resistance is an integrated resistor.

4. The circuit arrangement of claim 1, wherein the load current flowing through the main transistor is proportional to the measure of the load current flowing through the sensing transistor.

5. The circuit arrangement of claim 1, wherein the main transistor and the sensing transistor each comprise a control terminal and the control terminal of the sensing transistor is connected to the control terminal of the main transistor.

6. The circuit arrangement of claim 1, wherein the main transistor and the sensing transistor are formed as MOS transistors.

7. The circuit arrangement of claim 1, wherein the main transistor and the load define a series circuit and the series circuit is connected between terminals for a supply potential and a reference potential.

8. The circuit arrangement of claim 1, wherein the circuit arrangement forms a low-side switch or a high-side switch.

9. A circuit arrangement for detecting a load current through a load, the circuit arrangement comprising:
a main transistor having a load path through which the load current passes, wherein the load is connected in series with the load path of the main transistor;
a sensing transistor having a load path, wherein a measure of the load current flows through the load path of the sensing transistor;
a resistance which is connected in series with the load path of the sensing transistor;
a current source which is connected to a node arranged between the sensing transistor and the resistance;

a detector which detects the load current flowing through the main transistor by measuring the voltage across the resistance; and a sign detector that detects a sign of the voltage across the resistance and a controller that controls a direction of the current supplied by the current source depending on the sign of the voltage across the resistance.

10. The circuit arrangement of claim 9, wherein the direction of the current supplied by the current source and controlled by the controller further depends on whether the load current flowing through the main transistor decreases or increases.

11. The circuit arrangement of claim 10, wherein the controller has access to a look-up table, which lists the direction of the current supplied by the current source versus the sign of the voltage across the resistance and the sign of a derivative of the load current flowing through the main transistor.

12. A circuit arrangement for sensing a first current flowing through a first transistor, the circuit arrangement comprising:

the first transistor through which the first current flows;

a second transistor through which flows a second current that is a measure of the current flowing through the first transistor;

a sensing resistor which is connected via a node to the second transistor;

a current source which feeds a current to or draws a current from the node between the second transistor and the sensing resistor, wherein the voltage across the sensing resistor is a measure for the first current flowing through the first transistor; and a voltage detector that measures the voltage across the sensing resistor and detects whether or not the current produced by the current source equals an amount of the second current flowing through the second transistor.

13. The circuit arrangement of claim 12, wherein the direction and/or the value of the current produced by the current source are controllable.

14. The circuit arrangement of claim 12, wherein the circuit arrangement is implemented in CMOS technology.

15. The circuit arrangement of claim 12, wherein the first current flowing through the first transistor is proportional to the second current flowing through the second transistor.

16. A circuit arrangement for sensing a first current flowing through a first transistor, the circuit arrangement comprising:

the first transistor through which the first current flows;

a second transistor through which flows a second current that is a measure of the current flowing through the first transistor;

a sensing resistor which is connected via a node to the second transistor;

a current source which feeds a current to or draws a current from the node between the second transistor and the sensing resistor, wherein the voltage across the sensing resistor is a measure for the first current flowing through the first transistor; and a sign detector that detects a sign of the voltage across the sensing resistor and a controller controls a direction of the current produced by the current source depending on the sign of the voltage across the sensing resistor.

17. The circuit arrangement of claim 16, wherein the direction of the current produced by the current source depends on whether the current flowing through the first transistor decreases or increases.

18. The circuit arrangement of claim 17, further comprising a look-up table accessible by the controller which lists direction of current produced by the current source versus the sign of the voltage across the sensing resistor and a sign of a derivative of the first current.

19. A method to sense the current flowing through a first transistor, comprising:

providing a second transistor through which flows a current that is a measure of the current flowing through the first transistor and a sensing resistor which is connected via a node to the second transistor;

feeding a current to or drawing a current from the node between the second transistor and the sensing resistor; and sensing the voltage across the sensing resistor which is a measure for the current flowing through the first transistor;

wherein sensing the voltage across the sensing resistor comprises detecting whether or not an amount of the current fed to or drawn from the node equals an amount of the current flowing through the second transistor.

20. The method of claim 19, wherein a direction and/or a value of current fed to or drawn from the node are controllable.

21. The method of claim 19, wherein the current flowing through the first transistor is proportional to the current flowing through the second transistor.

22. A method to sense the current flowing through a first transistor, comprising:

providing a second transistor through which flows a current that is a measure of the current flowing through the first transistor and a sensing resistor which is connected via a node to the second transistor;

feeding a current to or drawing a current from the node between the second transistor and the sensing resistor; and sensing the voltage across the sensing resistor which is a measure for the current flowing through the first transistor;

detecting a sign of the voltage across the sensing resistor and controlling whether the current is fed to or is drawn from the node depending on the sign of the voltage across the sensing resistor.

23. The method of claim 22, wherein the direction of the current further depends on whether the current flowing through the first transistor decreases or increases.

24. The method of claim 23, further comprising providing a look-up table, which lists a direction of the current versus a sign of the voltage across the sensing resistor and a sign of the derivative of the current flowing through the first transistor.

* * * * *